United States Patent

Bestwick et al.

[11] Patent Number: 6,001,173
[45] Date of Patent: Dec. 14, 1999

[54] METHOD OF FORMING A COMPOUND SEMICONDUCTOR FILM

[75] Inventors: Timothy David Bestwick, Oxford; Geoffrey Duggan, Deddington; Stewart Edward Hooper, Oxford; Tin Sung Cheng, Toton; Charles Thomas Bayley Foxon, Wollaton, all of United Kingdom

[73] Assignees: Sharp Kabushiki Kaisha, Osaka, Japan; University of Nottingham, Nottingham, United Kingdom

[21] Appl. No.: 08/866,527

[22] Filed: May 30, 1997

[30] Foreign Application Priority Data

Jun. 1, 1996 [GB] United Kingdom ............... 9611471

[51] Int. Cl.$^6$ .................................. C30B 25/02
[52] U.S. Cl. .................. 117/89; 117/93; 117/102; 117/103; 427/255.7
[58] Field of Search ................ 117/84, 86, 89, 117/92, 93, 102, 103; 422/245.1; 427/255.7; 438/47

[56] References Cited

U.S. PATENT DOCUMENTS

| | | | |
|---|---|---|---|
| 4,517,047 | 5/1985 | Chang et al. | 156/610 |
| 4,829,022 | 5/1989 | Kobayashi et al. | 437/107 |
| 4,902,643 | 2/1990 | Simawaki | 437/89 |
| 4,975,388 | 12/1990 | Guedon et al. | 437/133 |
| 5,015,353 | 5/1991 | Hubler et al. | 204/192 |
| 5,091,335 | 2/1992 | Grunthaner et al. | 437/108 |
| 5,544,618 | 8/1996 | Stall et al. | 117/102 |
| 5,633,192 | 5/1997 | Moustakas et al. | 438/46 |
| 5,637,146 | 6/1997 | Chyi | 117/200 |

FOREIGN PATENT DOCUMENTS

| | | |
|---|---|---|
| 0345859 | 12/1989 | European Pat. Off. . |
| 0390552 | 10/1990 | European Pat. Off. . |
| 0525297 | 5/1997 | European Pat. Off. . |
| 1469978 | 4/1977 | United Kingdom . |
| 2210502 | 6/1989 | United Kingdom . |
| 2284431 | 6/1995 | United Kingdom . |

OTHER PUBLICATIONS

Search Report for Application No. GB 9611471.5; Dated Jul. 11, 1996.
A. Ishida et al., Appl. Phys. Lett., vol. 67, No. 5, pp. 665–666, 1995 "Growth of GaN Films by Hot Wall Epitaxy."
S.E. Hopper et al., J. Crystal Growth, vol. 155, pp. 157–163, 1995 "Some Aspects of GaN Growth on GaAs (100) Substrates Using Molecule Beam Epitaxy with an RF Activated Nitrogen–Plasma Source."
Search Report for Application No. 97303690.8–2104–; Dated Sep. 14, 1998 (EPO).
S.K. Haywood et al., Journal of Crystal Growth, vol. 93, No. 1–4, Nov. 1988, pp. 56–61, "Growth of GaSb by MOVPE; Optimization of Electrical Quality With Respect to Growth Rate, Pressure, Temperature and III/V Ratio".
A. Kikuchi et al., Journal of Crystal Growth, vol. 150, May 1995, pp. 897–901, "Effects of V/III Supply Ration on Improvement of Crystal Quality of Zincblende GaN Grown by Gas Source Molecular Beam Epitaxy Using . . . ".

Primary Examiner—Felisa Hiteshew

[57] ABSTRACT

A method of forming a smooth, continuous compound semiconductor film, e.g., a GaN film, is provided. When a GaN film is formed in accordance with this method, Ga is caused to arrive at a sapphire substrate in accordance with a first arrival rate profile over a growth period during which the film is formed, and nitrogen is caused to arrive at the substrate in accordance with a second arrival rate profile over the growth period. The first and second arrival rate profiles are such that the Ga and N are caused to arrive simultaneoulsly at the substrate over the growth period and so that (i) during an initial part of the growth period, growth of the film takes place under a stoichiometric exccess of Ga and (ii) during a subsequent part of the growth period, growth of the film takes place under a stoichiometric excess of N.

16 Claims, 4 Drawing Sheets

METHOD OF FORMING A COMPOUND SEMICONDUCTOR FILM

This invention relates to a method of forming a compound semiconductor film and is more particularly concerned with an improvement in the method commonly known as molecular beam epitaxy (MBE), which is also known as gas-source MBE (GSMBE) and chemical beam epitaxy (CRE).

In MBE, molecular beams, generated by heating chemicals to create a suitable vapour pressure either inside or external to a vacuum system, are allowed to impinge on a heated substrate in a high or ultra-high vacuum environment. On the substrate they react chemically to form a compound semiconductor. By supplying additional elements, dopants may be introduced. In the growth of III–V compounds (eg GaAs) or II–VI compounds (eg ZnSe), stoichiometric material is obtained if the excess of one of the elements is lost by re-vaporation. For III–V compounds, this usually occurs when excess Group V element (eg As) is supplied, and the growth rate is then controlled by the arrival rate of the Group III element (eg Ca).

At low substrate temperatures, however, the residence time of the species is longer and small amounts of additional As are incorporated into the growing film making the material semi-insulating, and also making the crystalline quality of the material less ideal. Variants of the basic MBE method can be used to improve film properties, including atom layer epitdxy (ALE), also known as migration enhanced epitaxy (MEE), in which the Group III and Group V elements are supplied (a) sequentially or (b) under very care-fully controlled V:III flux ratios. In the former method (a), there is difficulty associated with the sequential nature of the process which makes the overall growth rate slow and the frequent operation of the shutters or valves tends to lead to instrument failures. The latter method (b) requires such exact control over the flux ratio throughout the growth period that natural variations across the surface make this a difficult method for large area growth.

In the case of the Group III nitrides (eg AIN, GaN and InN), the large mismatch of lattice parameter leads to an additional problem. For films grown under nitrogen-rich conditions, growth occurs in disconnected vertical crystalline islands making electrical conductivity in any direction perpendicular to growth very small. For the same materials, growth under Grotip III-rich conditions gives a continuous film, but crystalline islands grow from the background, with excess Group III element on top. Neither type of film is suitable for use in fabricating electronic or optoelectronic devices.

A Ishida et al in Appl. Phys. Lett., volume 67 (5), Jul. 31, 1995, pages 665–6, disclose various procedures for growing GaN films on sapphire substrates by so-called "hot wall epitaxy". In one procedure, a GaN film is grown directly on the substrate from Ga and $NH_3$ sources. In another procedure, a layer of GaN is pre-deposited, followed by nitridation with ammonia. In a further procedure, a GaN film is grown on a GaN initial layer prepared by nitridation of a pre-deposited Ga layer. However, GaN films directly prepared on the sapphire substrate are of inferior quality because they are polycrystalline. The pre-deposition of gallium on the substrate, followed by ritridation with ammonia can result in a homogeneous film structure. However, in order to overcome the large lattice mismatch between GaN and sapphire, the majority of MBE workers employ a combination of pre-growth nitridation and a low temperature GaN or AIN buffer. With the present low growth rates available in MBE, this can be a lengthy and complex process.

GB-A-2284431 discloses a process involving building up a multiplicity of layers whose stolchiometry changes gradually from a mainly TiN or TiN alloy phase to a mainly Au or Au alloy phase, and particularly discloses the use of three Ti targets and one Au target, with the introduction of nitrogen gas into the vacuum chamber to form a TiN plating layer.

GB-A-2210502 discloses a method of growing GaAs films on substrates which involves the use of MEE in the initial stages to produce a GaAs buffer layer before the main GaAs film is grown in a standard way using known MBE procedures in which both components are applied simultaneously. Such procedures suffers from the above-noted disadvantages of using MEE.

GB-A-1469978 discloses the pre-heating of a substrate under an excess of As, followed by epitaxial growth of GaAs layers in which such growth takes place continuously using a constant Ga/As ratio of Ga to As.

EP-A-0525297 discloses a GSMBE procedure for forming a multi-layer doped GaAs epitaxial layer structure wherein arsine feed is effected continuously whilst triethyl gallium is stopped intermittently whilst dopant is fed.

U.S. Pat. No. 5,091,335 also discloses a form of MEE process where the group III and V atoms do not arrive simultaneously, and the in and as fluxes are constant.

U.S. Pat. No. 5,015,353 discloses a method of producing films of silicon nitride which dues not involve epitaxial growth. The stoichiometry of the film can be controlled either to pre-select the stoichiometry or to pre-selectively vary the stoichiometry with the depth of film deposition for the purpose of controlling the refractive index. Production of films with constant stoichiometry using the techniques described requires constant Si and N fluxes throughout the deposition procedure.

U.S. Pat. No. 4,902,643 discloses an ALE process for epitaxial deposition of Group III and V atoms, ie a process in which the Group III and V atoms do not arrive simultaneously.

U.S. Pat. No. 4,517,047 discloses a procedure wherein each layer of a multilayer device is grown by MBE under conditions such that the Group V/III ratio is constant throughout the growth period of such layer.

It is an object of the present invention to provide an improved method of forming a compound semiconductor film which can enable a smooth film to be obtained in a reliable and reproducible manner.

According to the present invention, there is provided a method of forming a compound semiconductor film in which first and second components of the compound semicuriductor are in a predetermined stoichiometric ratio, said method comprising the steps of (a) causing the first component to arrive at a substrate in accordance with a first arrival rate profile over a growth period during which said film is formed, (b) causing the second component to arrive at said substrate in accordance with a second arrival rate profile over said growth period; wherein the first and second arrival rate profiles are such that the first and second components are caused to arrive simultaneously at the substrate over said growth period and so that (i) during an initial part of said growth period, growth of the film takes place under a stoichiometric excess of the first component and (ii) during a subsequent part of the growth period, growth of the film rakes place under a stoichiometric excess of the second component.

The arrival rate of each component is determined by the supply rate or flux of such component in a vacuum chamber of the MBE apparatus in which the substrate is disposed.

Thus, the arrival rate can be varied by varying the supply rate or flux of the component into the vacuum chamber.

Preferably, the initial part of the growth period does not exceed about 5.5 minutes, and more preferably about 4.5 to 5.5 minutes.

Preferably, said subsequent part of the growth period represents the remaining part of the growth period after said initial part. Preferably, said subsequent part represents more than 50% of the growth period.

Preferably also, the stoichiometric ratio of the first component to the second component is varied throughout at least the initial part of the growth period.

One of the first and second arrival rate profiles may be such that such arrival rate is substantially constant during the growth period, whilst the other arrival rate profile may be such that such arrival rate varies over the growth period.

In one convenient embodiment, the first arrival rate profile is such that the arrival rate of the first component is substantially constant throughout the growth period, whilst the second arrival rate profile is such that the second component arrives initially in a stoichiometrically deficient amount during said initial period and subsequently in a stoichiometrically excess amount.

In another convenient embodiment, the first arrival rate profile is such that the first component arrives in a stoichiometrically excess amount during said initial period and then arrives subsequently in a stoichiometrically deficient amount, whilst the second arrival rate profile is such that the arrival rate of the second component is substantially constant throughout the growth period.

Preferably, the stoichiometric ratio of the first component to the second component is varied substantially continuously throughout at least the initial part of the growth period.

Most preferably, the stoichiometric ratio of the second component to the first component is (0.85±0.02):1 at the start of the growth period and is changed to about 1:1 over 5±0.5 minutes, after which said stoichiometric ratio is changed to 1.13:1 over the next 4 minutes.

The invention is particularly, but not exclusively, concerned with the growth of Group III–V compound semiconductors wherein the Group III element constitutes the first component and the Group V element constitutes the second component.

Preferably, the stoichiometric excess at the start of the initial part of said growth period is in the range of 13–17% (V/III=0.85±0.02).

The invention is particularly applicable to the growth of GaN directly on a sapphire substrate.

The method of the present invention provides a reliable and reproducible way of forming continious smooth films of Group III nitrides suitable for the fabrication of electronic or opto-electronic devices. Additionally, precise control over the stoichiometry of the arriving species at all times throughout the growth period is not required, the only requirement being that the overall stoichiometry is in accordance with the predetermined troichiometric ratio by the end of the growth period.

Furthermore, because the first and second components of the compound semiconductor are supplied simultaneously, the growth rate is relatively high and shutters or valves do not need frequent operation, thereby making the epitaxial process more reliable.

The present invention may include the step of including one or more dopants to produce conducting films suitable, for example, for field effect transistor operation or other devices needing lateral current conduction.

Other features and advantages of the present invention will now be described with reference to the accompanying drawings, in which:

FIG. 1 is a plotomicrograph of a GaN film grown in accordance with one embodiment of the method according to the present invention;

FIG. 2 is a graph showing the variation with rime of nitrogen plasma optical discharge or OED voltage from a plasma nitrogen source operated at two power rates in the growth of GaN films. The optical discharge is a semi-quantirative measure of the flux rate from the plasma source (S. E. Hooper et al, J. Cryst. Growth, 155 (1995), 157–163);

Figure 1:
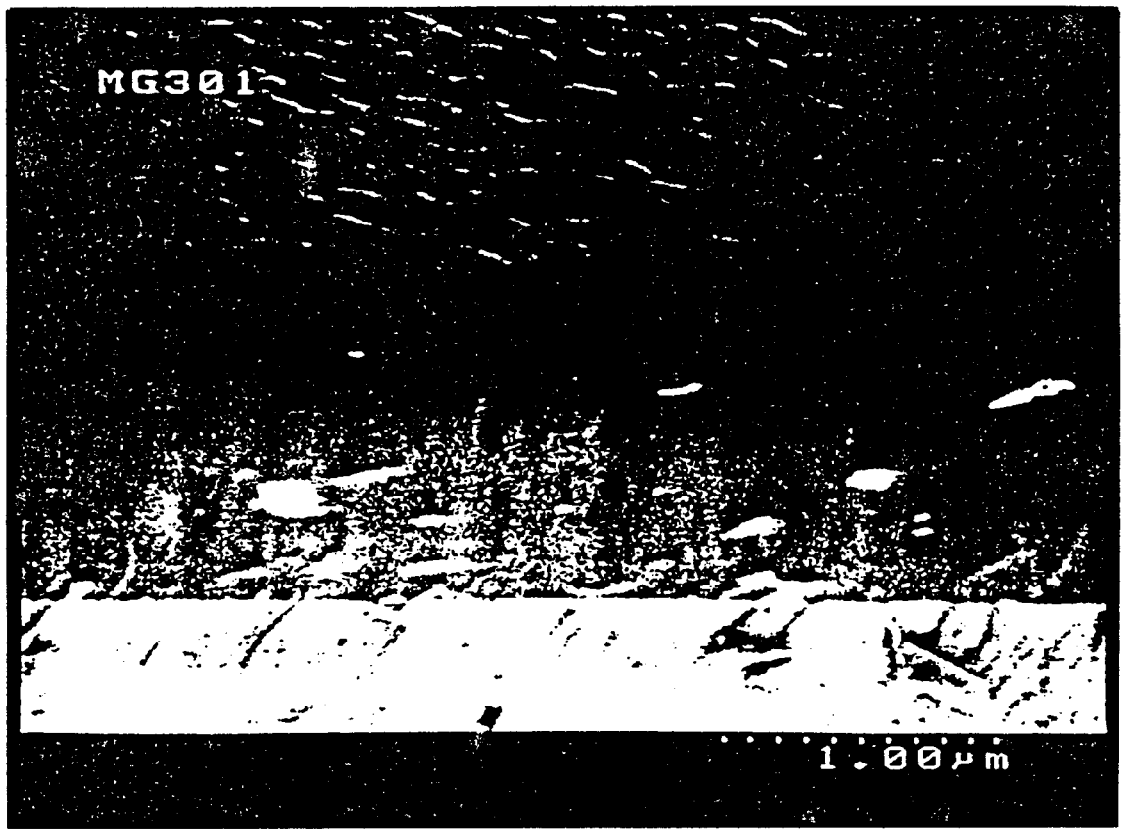
FIG. 1 shows a smooth, continuous GaN film produced in accordance with the present invention. Such a film is eminently suitable for use in the fabrication of a range of a electronic and opto-electronic devices.

The film of FIG. 1 was grown using a commercial MBE system (Varlan/EPI Modular Gen II) using conventional solid sources throughout, except the nitrogen source which was supplied from a commercial plasma source (Oxford Applied Research Radical Source).

Figure 2:
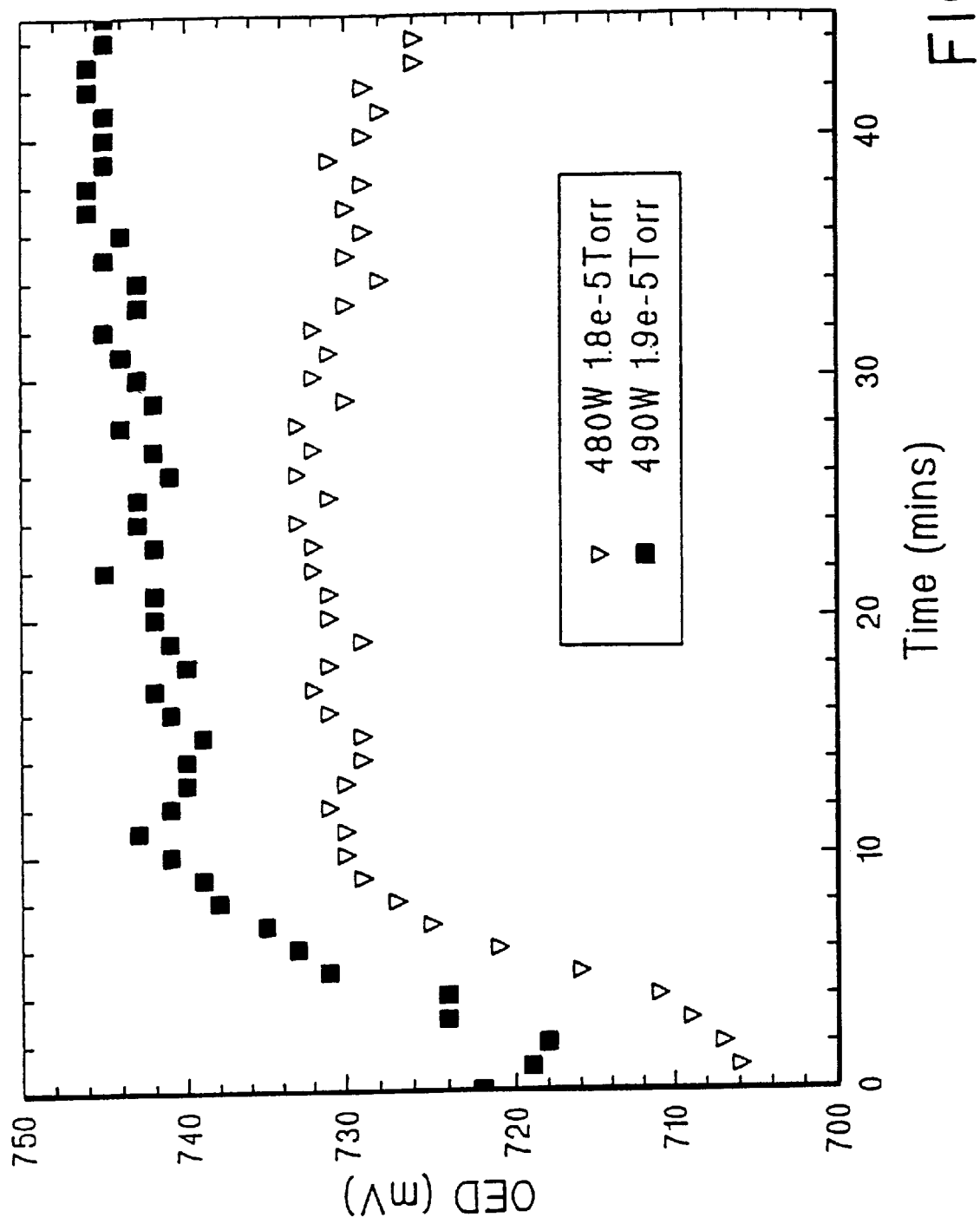

The plasma nitrogen source was supplied with a flow of nitrogen which results in a pressure of $1.8 \times 10^{-5}$ torr ($2.4 \times 10^{-6}$ Pa), and 480 W of radio frequency power. The source was equipped with a photodiode for monitoring the optical output of the plasma, and this was maintained at a near-constant value, su that the nitrogen flux was approximately constant. The nitrogen source was allowed to stabilize for approximately 10 minutes before growth commenced. FIG. 2 shows that the flux after the first 10 minutes is substantially constant, and also shows the flux profile at a slightly higher power of 490 W and a pressure of $1.9 \times 10^{-5}$ torr ($2.53 \times 10^{-6}$ Pa)

The Ga flux was measured using an ion gauge, and the values of Ga flux quoted are the "beam equivalent pressure" (BEP) measured by the ion gauge.

The substrates onto which the GaN was grown are commercially-available 50 mm diameter sapphire wafers, with polished (0001) surfaces. The back side of the wafers had been coated with Mu to allow radiative heating of the substrates in the MBE system. The surfaces of the sapphire wafers were cleaned in acetone before loading into the MBE system, and once in the MBE system the wafers were heated to 300° C. for 3–4 hours then 800° C. for 30 minutes.

Figure 3:
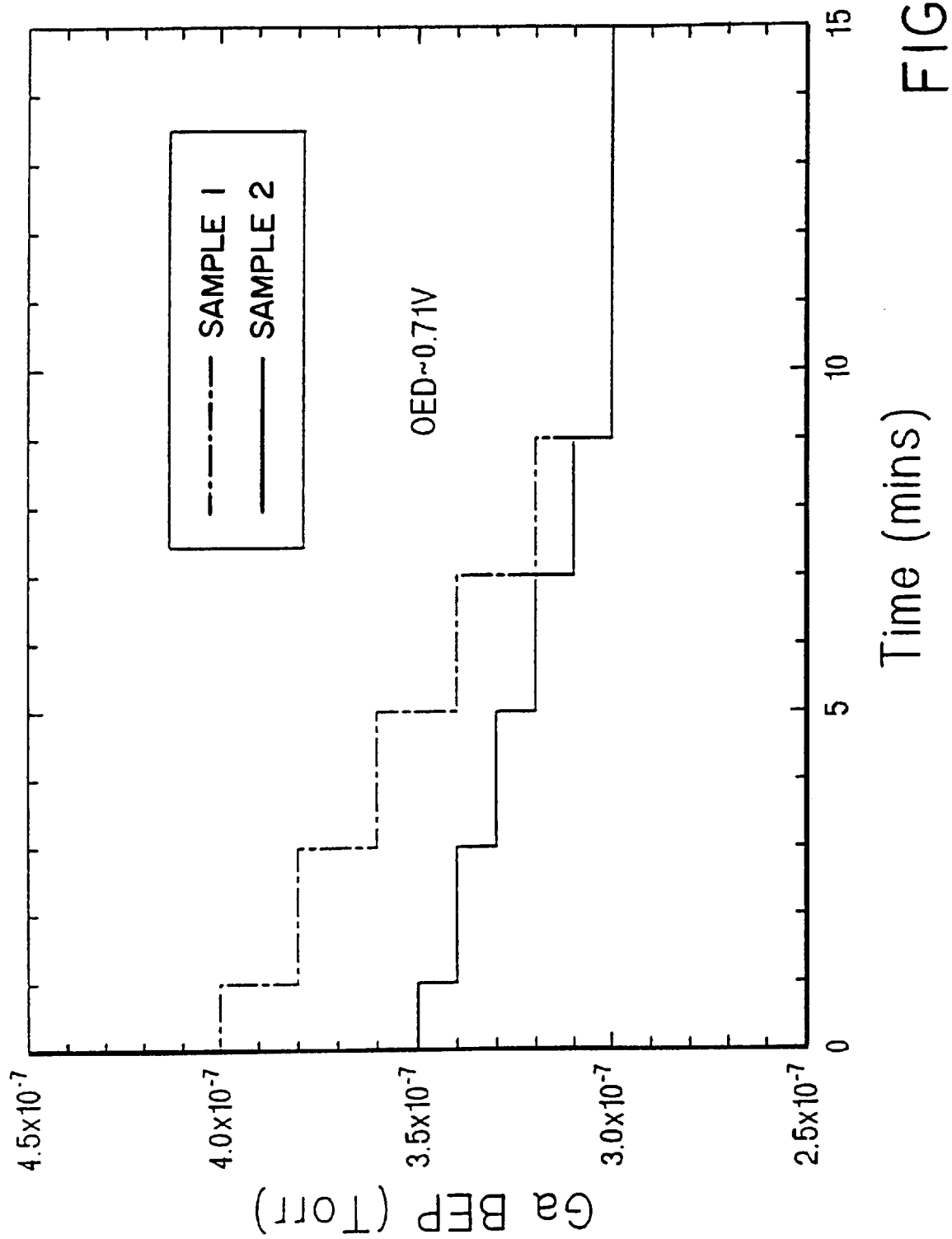
FIG. 3 is a graph showing the variation in Ga flux used to grow the GaN film illustrated in FIG. 1 under a constant N flux or OED voltage.

The growth of GaN was carried out with the sapphire substrate heated to 750° C. There was no nitridation of the substrate prior to growth, and no "buffer layer" was grown. In accordance with the invention (see FIG. 3 -sample 1), the Ga flux was gradually reduced from $4 \times 10^{-7}$ torr ($5.33 \times 10^{-8}$ Pa, V/III=0.85) to $3 \times 10^{-7}$ torr ($4 \times 10^{-8}$ Pa, V/III=1.13) over 9 minutes whilst the nitrogen flux (as monitored by the photodiode output) was kept constant at $1.8 \times 10^{-5}$ torr ($2.4 \times 10^{-6}$ Pa). During this 9 minute period, a Ga flux of $3.4 \times 10^{-7}$ torr (V/III=1) was reached after 5 minutes and was continued for 2 minutes before being reduced further. After the 9 minute period, growth was continued at a Ga flux rate of $3 \times 10^{-7}$ torr ($4 \times 10^{-8}$ Pa, V/III=1.13) for a sufficient time to produce the desired GaN thickness. This steady-state growth rate was approximately 0.25 µm per hour. After growth of the layer of GaN had been completed, the layer was allowed to cool under a nitrogen flux.

It has been found that, if the initial Ga flux is $3.5 \times 10^{-7}$ torr ($4.67 \times 10^{-8}$ Pa, V/III=0.97) and this is gradually reduced to $3 \times 10^{-7}$ torr ($4 \times 10^{-8}$ Pa, V/III=1.13) over 9 minutes (see FIG. 3-sample 2), then the resulting GaN has poor luminescence and poor morphology, and is typical of GaN grown under solely nitrogen-rich conditions (described previously). During such a procedure, a Ga flux of $3.4 \times 10^{-7}$ torr (V/III=1) is reached after 1 minute. On the other hand, an initial Ga flux of $5 \times 10^{-7}$ torr ($6.67 \times 10^{-8}$ Pa, V/III=0.68) which is reduced to $3 \times 10^{-7}$ tor ($4 \times 10^{-8}$ Pa, V/III=1.13) over 9 minutes, with a Ga flux of $3.4 \times 10^{-7}$ torr (V/III=1) being reached after about 6.5 minutes, results in material which is typical of GaN grown under Ga-rich conditions (described previously), containing metallic Ga and isolated crystallites of GaN and this material is also unsuitable for fabricating into devices. When the Ga flux is reduced from $5 \times 10^{-7}$ torr ($6.67 \times 10^{-8}$ Pa, V/III=0.68) to $3 \times 10^{-7}$ torr ($4 \times 10^{-8}$ Pa, V/III=1.13) over 5 minutes, with a Ga flux of $3.4 \times 10^{-7}$ torr (V/III=1) being reached after about 3.5 minutes, the material is similarly Ga-rich and of poor quality. Material produced when the Ga flux is initially $4 \times 10^{-7}$ torr ($5.33 \times 10^{-8}$ Pa, V/III=0.85) and is reduced to $3 \times 10^{-7}$ torr ($4 \times 10^{-8}$ Pa, V/III=1.13) over 9 minutes, in The manner described above, produces good quality GaN material, with good luminescence properties and good morphology. Furthermore, electrical measurements on doped layers grown under these conditions indicate that the layers are continuous.

In the embodiment according to the invention described above with reference to FIG. 3, the Ga flux was varied whilst keeping the N flux constant. It is to be understood, however, that similar results can be achieved by varying the N flux whilst keeping the Ga flux constant so as to achieve the above-indicated V/III ratios at each stage of the growth.

Figure 4:
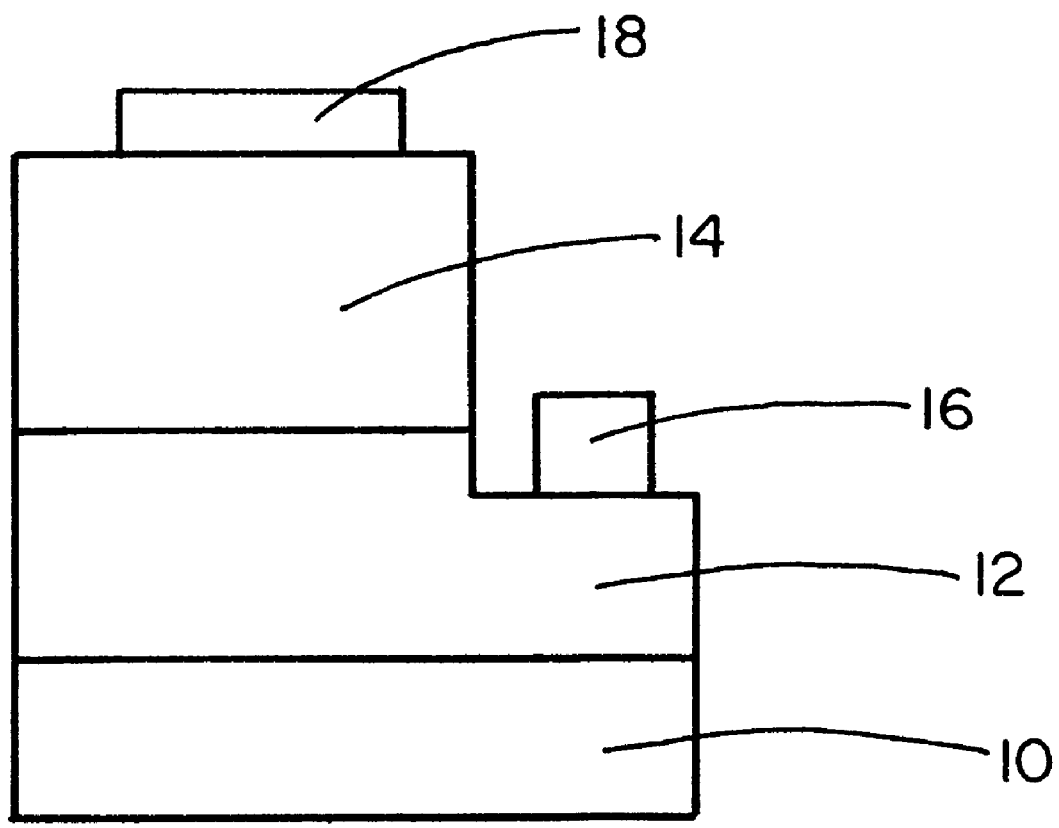
FIG. 4 is a schematic diagram of a heterojunction device incorporating a film produced in accordance with the present invention.

The film produced according to the present invention may be incorporated into any desired type of electronic or optoelectronic device. A simple example of such a device is the heterojunction device illustrated in FIG. 4. In FIG. 4, a sapphire substrate 10 has an n-type GaN layer 12 grown thereon using the method of the present invention with n-type dopant being included during the epitaxial growth period. A p-type GaN layer 14 is grown on the n-type layer 12 and n- and p-type contacts 16 and 18 are provided on the respective layers 12 and 14.

What is claimed is:

1. A method of forming a compound semiconductor film in which first and second components of the compound semiconductor having a stoichiometric ratio, said method comprising the steps of:
   (a) causing the first component to arrive at a substrate in accordance with a first arrival rate profile over a growth period of forming said film is formed, and
   (b) causing the second component to arrive at said substrate in accordance with a second arrival rate profile over said growth period,
   wherein the first and second arrival rate profiles are such that the first and second components are caused to arrive simultaneously at the substrate over said period to arrive simultaneously at the substrate over said growth period and so that (i) during an initial part of said growth period, growth of the film takes place under a stoichiometric excess of the first component and (ii) during a subsequent part of the growth period, growth of the film takes place under a stoichiometric excess of the second component.

2. A method according to claim 1, wherein the initial part of the growth period does not exceed 5.5 minutes.

3. A method according to claim 2, wherein the initial part of the growth period is 4.5 to 5.5 minutes.

4. A method according to claim 1, wherein the stoichiometric excess of the first component at the start of said growth period is in the range of 13–17%.

5. A method according to claim 1, wherein said subsequent part of the growth period represents the remaining pert of the growth period after said initial part.

6. A method according to claim 5, wherein said subsequent part represents more than 50% of the growth period.

7. A method according to claim 1, wherein the stoichiometric ratio of the first component to the second component is varied throughout at least the initial part of the growth period.

8. A method according to claim 1, wherein one of the first and second arrival rate profiles is such that the arrival rate of the relevant component is substantially constent during the growth period, whilst the other arrival rate profile is such that the arrival rate of the relevant component varies over the growth period.

9. A method according to claim 8, wherein the first arrival rate profile is such that the arrival rate of the first component is constant throughout the growth period, whilst the second arrival rate profile is such that the second component arrives initially in a stoichiometrically deficient amount during said initial period and subsequently in a stoichiometrically excess amount.

10. A method according to claim 8, wherein the first arrival rate profile is such that the first component arrives in a stoichiometrically excess amount during said initial period and then arrives subsequently in a stoichiometrically deficient amount, whilst the second arrival rate profile is such that the arrival rate of the second component is substantially constant throughout the growth period.

11. A method according to claim 1, wherein a Group III element constitutes the first component and a Group V element constitutes the second component.

12. A method according to claim 1, wherein the stoichiometric ratio of the second component to the first component is $(0.85 \pm 0.02):1$ at the start of the growth period and is changed to about 1:1 over $5 \pm 0.5$ minutes, after which said stoichiometric ratio is changed to 1.13:1 over the next 4 minutes.

13. A method according to claim 1, wherein the first component is gallium and the second component is nitrogen.

14. A method according to claim 1, wherein the substrate is a sapphire substrate.

15. A method according to claim 1, further comprising the step of including one or more dopants in the film.

16. An electronic or optoelectronic device, the electronic or optoelectronic device comprising at least one compound semiconductor film which is produced by a method according to claim 1.

* * * * *